(12) United States Patent
Park et al.

(10) Patent No.: US 9,972,246 B2
(45) Date of Patent: May 15, 2018

(54) PIXEL AND ORGANIC LIGHT EMITTING DISPLAY INCLUDING THE SAME

(71) Applicant: SAMSUNG DISPLAY CO., LTD., Yongin, Gyeonggi-Do (KR)

(72) Inventors: Dong-Won Park, Yongin (KR); Joon-Chul Goh, Yongin (KR); Seok-Ha Hong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 37 days.

(21) Appl. No.: 14/609,352

(22) Filed: Jan. 29, 2015

(65) Prior Publication Data
US 2015/0243217 A1 Aug. 27, 2015

(30) Foreign Application Priority Data

Feb. 26, 2014 (KR) .................. 10-2014-0022504

(51) Int. Cl.
*G09G 3/3258* (2016.01)
*G09G 3/3233* (2016.01)
*H01L 27/32* (2006.01)

(52) U.S. Cl.
CPC ......... *G09G 3/3258* (2013.01); *G09G 3/3233* (2013.01); *G09G 2300/0819* (2013.01); *G09G 2300/0842* (2013.01); *G09G 2320/0233* (2013.01); *G09G 2320/0295* (2013.01); *G09G 2360/148* (2013.01); *H01L 27/3269* (2013.01)

(58) Field of Classification Search
CPC ....... G09G 2320/046; G09G 2320/045; G09G 2320/043; G09G 2320/029; G09G 2320/0295; G09G 2320/0233; G09G 2320/048; G09G 2320/0214; G09G 2360/148; G09G 2360/14;
(Continued)

(56) References Cited

U.S. PATENT DOCUMENTS

2005/0099372 A1* 5/2005 Nakamura ............ G06F 3/0412
345/79
2005/0199876 A1 9/2005 Matsumoto
(Continued)

FOREIGN PATENT DOCUMENTS

JP 2012-109970 A 6/2012
KR 10-2006-0041707 A 5/2006
(Continued)

*Primary Examiner* — Ilana Spar
*Assistant Examiner* — Amen Bogale
(74) *Attorney, Agent, or Firm* — Lewis Roca Rothgerber Christie LLP

(57) ABSTRACT

Provided is a pixel including an organic light emitting diode, a driving circuit, and a light receiving circuit. The driving circuit is configured to supply a driving current corresponding to a data signal supplied through a data line during a scan period to the organic light emitting diode during an emission period, and to supply a first sensing current corresponding to threshold voltage/mobility information of a driving transistor or degradation information of the organic light emitting diode to a feedback line during a current sensing period. The light receiving circuit is configured to supply a second sensing current corresponding to luminance of the organic light emitting diode to the feedback line during the emission period.

17 Claims, 6 Drawing Sheets

(58) Field of Classification Search
CPC ....... G09G 2360/141; G09G 2360/142; G09G 2360/145; G09G 2360/147; G09G 2360/16
See application file for complete search history.

(56) References Cited

U.S. PATENT DOCUMENTS

| | | | |
|---|---|---|---|
| 2007/0080417 A1* | 4/2007 | Jung | H01L 27/3269 257/448 |
| 2007/0093007 A1 | 4/2007 | Deane | |
| 2009/0051628 A1* | 2/2009 | Kwon | G09G 3/3233 345/77 |
| 2010/0045650 A1 | 2/2010 | Fish et al. | |
| 2010/0201664 A1 | 8/2010 | Lee et al. | |
| 2011/0007067 A1* | 1/2011 | Ryu | G09G 3/3233 345/214 |
| 2011/0074750 A1 | 3/2011 | Leon et al. | |
| 2011/0191042 A1* | 8/2011 | Chaji | G09G 3/32 702/64 |
| 2011/0215224 A1* | 9/2011 | Kobayashi | G01J 1/42 250/208.2 |
| 2012/0120043 A1 | 5/2012 | Cho et al. | |
| 2012/0267513 A1* | 10/2012 | Jeon | H01L 27/1446 250/208.2 |
| 2013/0009888 A1 | 1/2013 | Park et al. | |

FOREIGN PATENT DOCUMENTS

| | | |
|---|---|---|
| KR | 10-2007-0003784 A | 1/2007 |
| KR | 10-2009-0072779 A | 7/2009 |
| KR | 10-2009-0086228 A | 8/2009 |
| KR | 10-2009-0104319 A | 10/2009 |
| KR | 10-2010-0091852 A | 8/2010 |
| KR | 10-2011-0068652 A | 6/2011 |
| KR | 10-2012-0087138 A | 8/2012 |

* cited by examiner

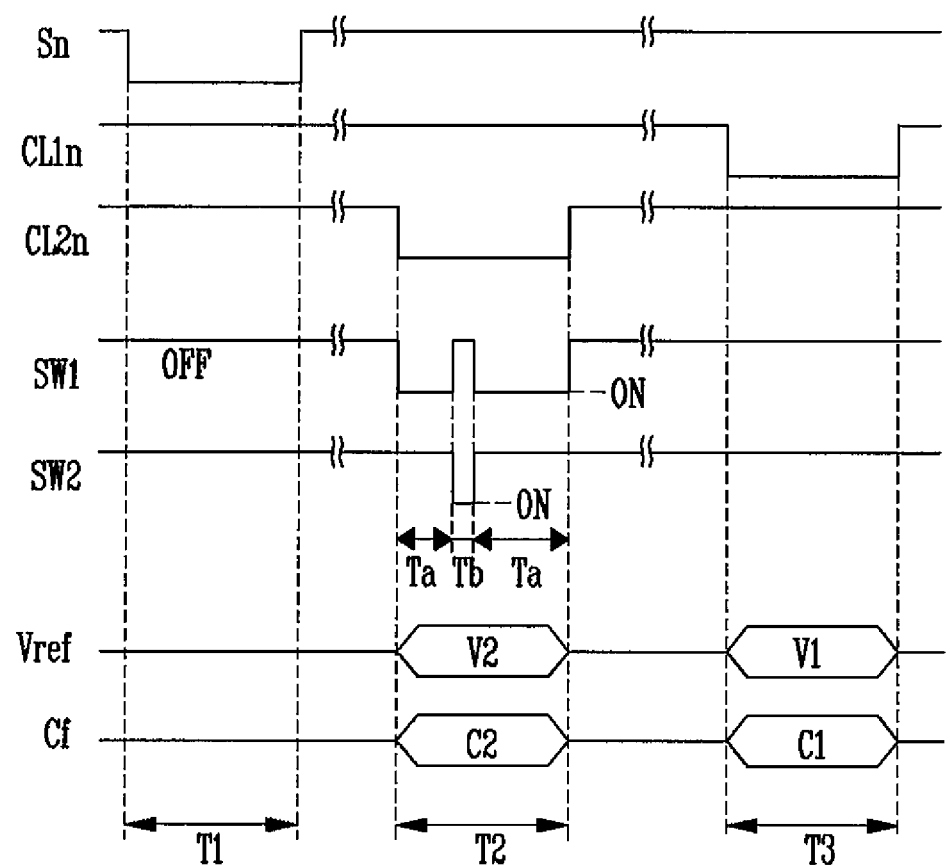

PIXEL AND ORGANIC LIGHT EMITTING DISPLAY INCLUDING THE SAME

CROSS-REFERENCE TO RELATED APPLICATION

This application claims priority to and the benefit of Korean Patent Application No. 10-2014-0022504, filed on Feb. 26, 2014, in the Korean Intellectual Property Office, the entire disclosure of which is incorporated herein by reference.

BACKGROUND

1. Field

Aspects of example embodiments of the present invention relate to a pixel and an organic light emitting display including the same.

2. Description of the Related Art

Recently, there have been developed various kinds of flat panel displays capable of reducing the weight and volume of cathode ray tubes. The various kinds of flat panel displays include a liquid crystal display (LCD), a field emission display (FED), a plasma display panel (PDP), an organic light emitting display (OLED), and the like.

Among these flat panel displays, the OLED displays images using (or utilizing) organic light emitting diodes that emit light through recombination of electrons and holes. The OLED has a fast response speed and is driven with low power consumption.

However, in the OLED, a difference in luminance between pixels may occur due to a difference between the pixels, e.g., a difference in threshold voltage/mobility between driving transistors, a difference in degradation between organic light emitting diodes, or the like. As the difference in luminance between the pixels occurs, a luminance spot may occur in the OLED, and the image quality of the OLED may be deteriorated.

SUMMARY

Aspects of embodiments are directed toward a pixel and an organic light emitting display including the same, which can remove a luminance spot by eliminating a difference between pixels.

According to an embodiment of the present invention, there is provided a pixel including: an organic light emitting diode; a driving circuit configured to supply a driving current corresponding to a data signal supplied through a data line during a scan period to the organic light emitting diode during an emission period, and to supply a first sensing current corresponding to threshold voltage/mobility information of a driving transistor or degradation information of the organic light emitting diode to a feedback line during a current sensing period; and a light receiving circuit configured to supply a second sensing current corresponding to luminance of the organic light emitting diode to the feedback line during the emission period.

The driving circuit may include a scan transistor configured to turn on in response to a scan signal to charge a capacitor with a voltage corresponding to a data signal supplied through a data line; a driving transistor configured to adjust an amplitude of the driving current supplied from a first power source to a second power source via the organic light emitting diode; and a first switching transistor coupled between an anode of the organic light emitting diode and the feedback line, the first switching transistor configured to turn on in response to a first sensing control signal.

The light receiving circuit may include: a photo transistor configured to generate the second sensing current corresponding to the luminance of the organic light emitting diode; and a second switching transistor coupled between the photo transistor and the feedback line, the second switching transistor configured to turn on in response to a second sensing control signal.

The scan signal may be supplied during the scan period, the first sensing control signal may be supplied during the current sensing period, and the second sensing control signal may be supplied during the emission period.

The photo transistor may include: a gate electrode configured to receive a first bias voltage; a source electrode configured to receive a second bias voltage; and a drain electrode coupled to the second switching transistor.

Each of the first and second bias voltages may be adjusted according to an accumulation emission time of the organic light emitting diode.

According to another embodiment of the present invention, there is provided an organic light emitting display, including: a display unit including pixels respectively at crossing portions of data lines, scan lines, and feedback lines; a data driver configured to supply data signals to the data lines; a scan driver configured to sequentially supply scan signals to the scan lines; a sensing unit configured to generate current information corresponding to a first sensing current supplied during a current sensing period through a corresponding feedback line among the feedback lines from each one of the pixels and a second sensing current supplied during an emission period through the corresponding feedback line from the each one of the pixels; and a compensation unit configured to generate a compensation data including compensation values with respect to respective ones of each of the pixels, based on the current information.

The each one of the pixels may include: an organic light emitting diode; a driving circuit configured to supply a driving current corresponding to a data signal supplied through a corresponding data line among the data lines during a scan period to the organic light emitting diode during an emission period, and to supply the first sensing current corresponding to threshold voltage/mobility information of a driving transistor or degradation information of the organic light emitting diode to the corresponding feedback line during the current sensing period; and a light receiving circuit configured to supply the second sensing current corresponding to luminance of the organic light emitting diode to the corresponding feedback line during the emission period.

The driving circuit may include: a scan transistor configured to turn on in response to the scan signal to charge a capacitor with a voltage corresponding to the data signal supplied through the corresponding data line; a driving transistor configured to adjust an amplitude of the driving current supplied from a first power source to a second power source via the organic light emitting diode; and a first switching transistor coupled between an anode of the organic light emitting diode and the corresponding feedback line, the first switching transistor configured to turn on in response to a first sensing control signal.

The light receiving circuit may include: a photo transistor configured to generate the second sensing current corresponding to the luminance of the organic light emitting diode; and a second switching transistor coupled between the photo transistor and the corresponding feedback line, the second switching transistor configured to turn on in response to a second sensing control signal.

The organic light emitting display may further include a control line driver configured to supply the first sensing control signal during the current sensing period, and to supply the second sensing control signal during the emission period.

The photo transistor may include: a gate electrode configured to receive a first bias voltage; a source electrode configured to receive a second bias voltage; and a drain electrode coupled to the second switching transistor.

The organic light emitting display may further include a voltage adjusting unit configured to adjust the first bias voltage and the second bias voltage according to an accumulation emission time of the organic light emitting diode.

The organic light emitting display may further include a timing controller configured to convert a first image data supplied from an outside thereof into a second image data based on the compensation data, and to supply the second image data to the data driver.

The each one of the pixels may further include a reference organic light emitting diode coupled in parallel to the organic light emitting diode, the reference organic light emitting diode configured to be alternately turned on with the organic light emitting diode during the emission period.

The organic light emitting display may further include a voltage adjusting unit configured to adjust the first bias voltage and the second bias voltage based on the second sensing current supplied during a period in which the reference organic light emitting diode emits light.

A turn-on period of the organic light emitting diode may be longer than that of the reference organic light emitting diode.

BRIEF DESCRIPTION OF THE DRAWINGS

Example embodiments will now be described more fully hereinafter with reference to the accompanying drawings. However, aspects of the example embodiments may be embodied in various different forms and should not be construed as limited to the embodiments set forth herein. Rather, these embodiments are provided so that this disclosure will be thorough and complete, and will fully convey the spirit and scope of aspects of the example embodiments to those having ordinary skill in the art.

In the drawing figures, dimensions may be exaggerated for clarity of illustration. It will be understood that when an element is referred to as being "between" two elements, it can be the only element between the two elements, or one or more intervening elements may be present. Like reference numerals refer to like elements throughout.

FIG. 7 is a waveform diagram illustrating control signals supplied to the pixel and the sensing unit, shown in FIG. 5.

DETAILED DESCRIPTION

Figure 1:
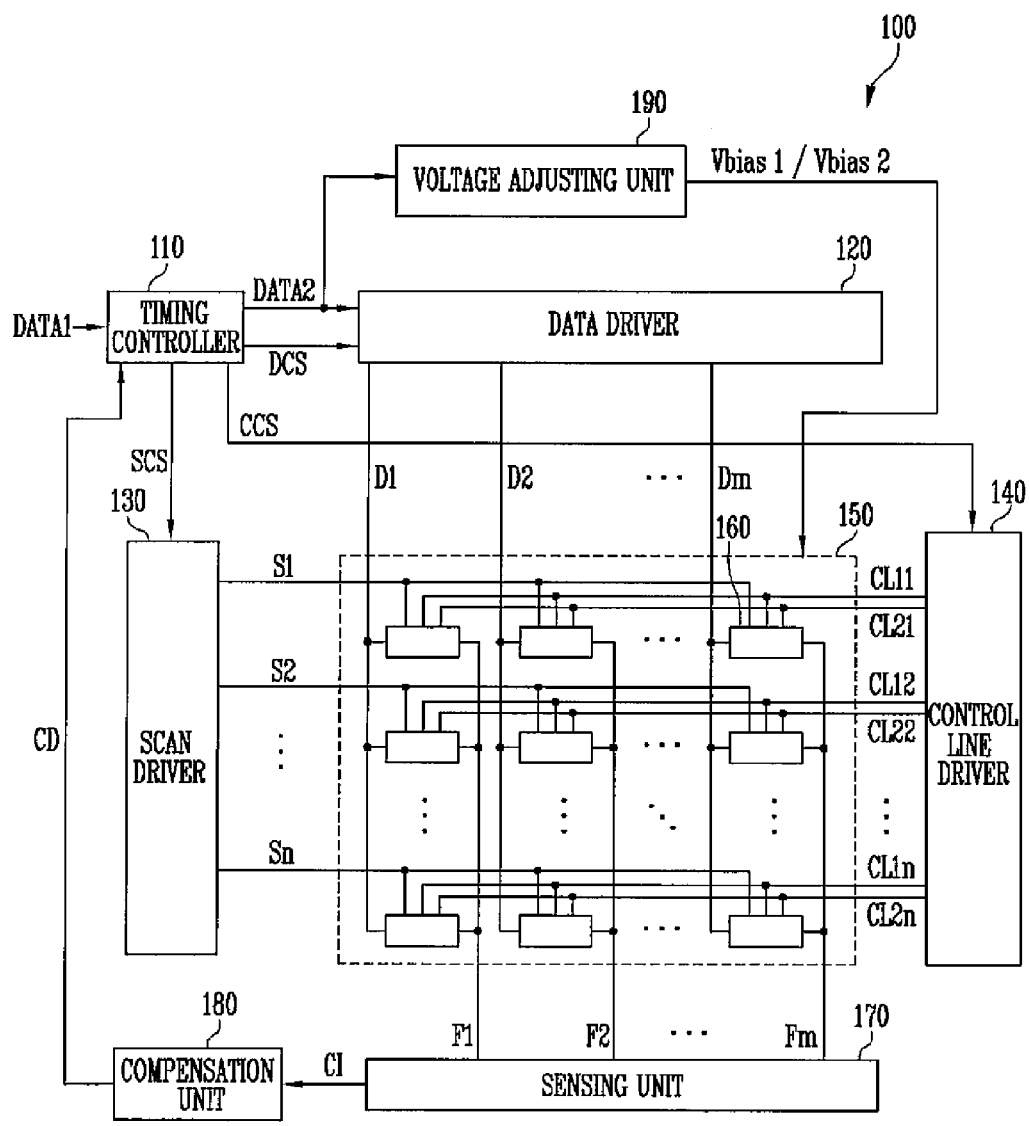
FIG. 1 is a block diagram illustrating an organic light emitting display according to an embodiment of the present invention.

Hereinafter, certain example embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not necessary to those having ordinary skill in the art for a complete understanding of the invention are omitted for clarity. Also, like reference numerals refer to like elements throughout.

Figure 2:
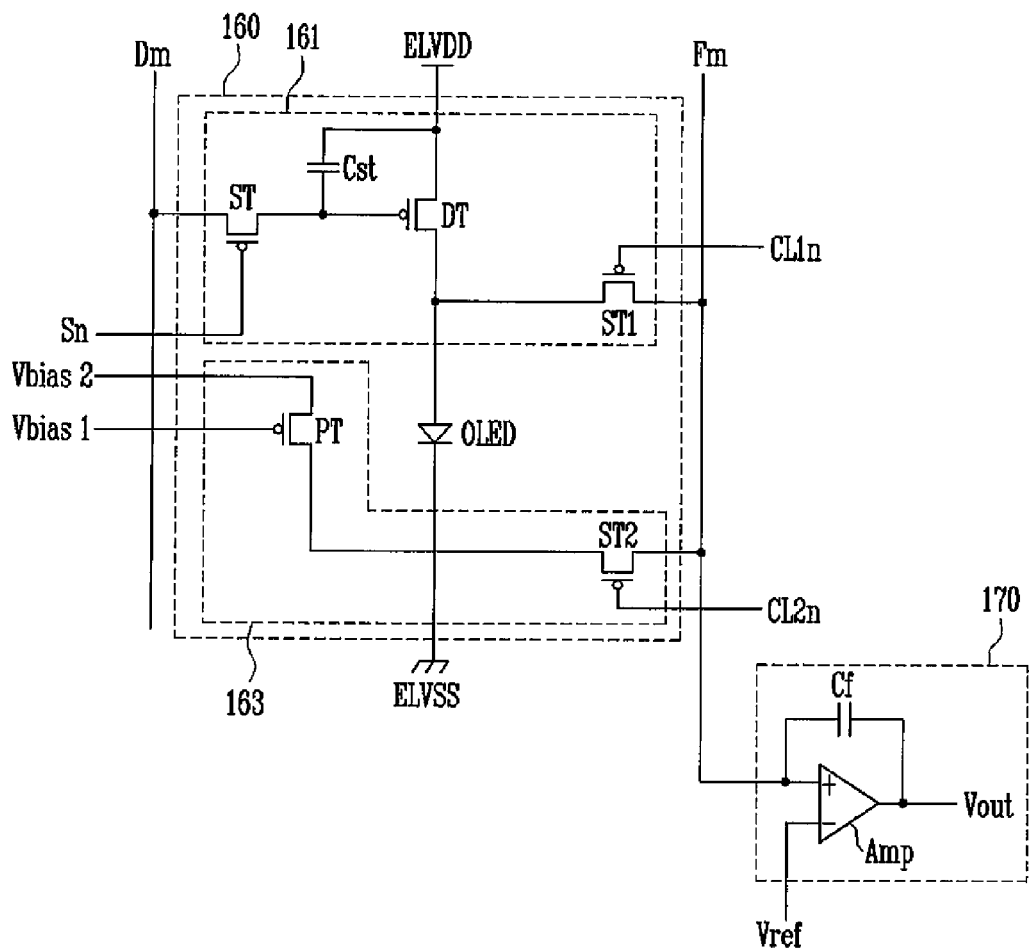
FIG. 2 is a circuit diagram illustrating a pixel and a sensing unit, shown in FIG. 1.
Figure 3:
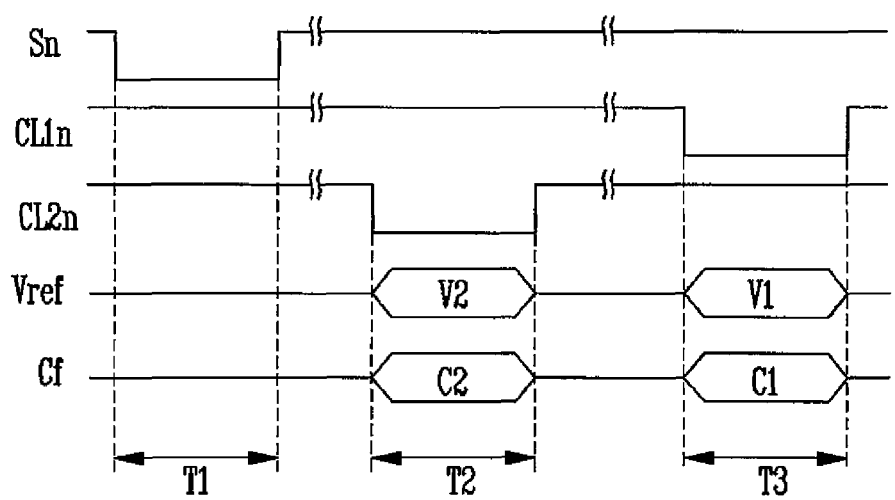
FIG. 3 is a waveform diagram illustrating control signals supplied to the pixel and the sensing unit, shown in FIG. 1.
Figure 4:
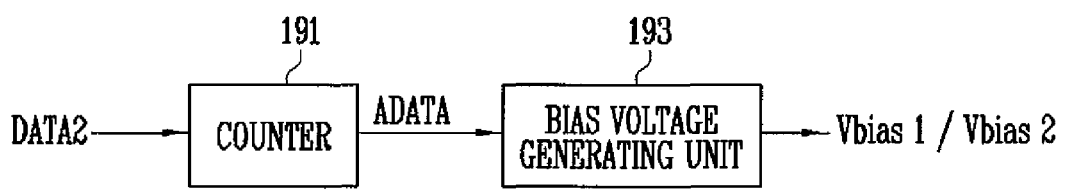
FIG. 4 is a block diagram illustrating a voltage adjusting unit shown in FIG. 1.

FIG. 1 is a block diagram illustrating an organic light emitting display according to an embodiment of the present invention. FIG. 2 is a circuit diagram illustrating a pixel and a sensing unit, shown in FIG. 1. FIG. 3 is a waveform diagram illustrating control signals supplied to the pixel and the sensing unit, shown in FIG. 1. FIG. 4 is a block diagram illustrating a voltage adjusting unit shown in FIG. 1.

Referring to FIGS. 1 to 4, the organic light emitting display 100 includes a timing controller 110, a data driver 120, a scan driver 130, a control line driver 140, a display unit 150, a sensing unit 170, and a compensation unit 180.

The timing controller 110 controls operations of the data driver 120, the scan driver 130, and the control line driver 140, in response to a synchronization signal supplied from an outside thereof. For example, the timing controller 110 generates a data driving control signal DCS, and supplies the generated data driving control signal DCS to the data driver 120. The timing controller 110 generates a scan driving control signal SCS, and supplies the generated scan driving control signal SCS to the scan driver 130. The timing controller 110 generates a control line driving control signal CCS and supplies the generated control line driving control signal CCS to the control line driver 140.

The timing controller 110 converts a first data DATA1 supplied from the outside into a second data DATA2, and supplies the converted second data DATA2 to the data driver 120. For example, the timing controller 110 converts the first data DATA1 into the second data DATA2, in response to a compensation data CD, and supplies the converted second data DATA2 to the data driver 120.

The data driver 120 realigns the second data DATA2 supplied from the timing controller 110, in response to the data driving control signal DCS output from the timing controller 110, and supplies the realigned second data DATA2 as data signals to data lines D1 to Dm. The data driver 120 supplies data signals during a scan period T1.

The scan driver 130 sequentially supplies a scan signal to scan lines S1 to Sn, in response to the scan driving control signal SCS output from the timing controller 110.

The control line driver 140 sequentially supplies sensing control signals to sensing control lines CL11 to CL1n and CL21 to CL2n, in response to the control line driving control signal CCS output from the timing controller 110. The control line driver 140 sequentially supplies a first sensing control signal to first sensing control lines CL11 to CL1n during a current sensing period T3. In addition, the control line driver 140 sequentially supplies a second sensing control signal to second sensing control lines CL21 to CL2n during an emission period T2.

For convenience of illustration and description, the period where a capacitor Cst charges a voltage corresponding to the data signal supplied through the data line D1 to Dm is referred to as a 'scan period T1', and the period where an organic light emitting diode OLED emits light with a luminance corresponding to the voltage charged in the capacitor Cst is referred to as an 'emission period T2'. In addition, the period where threshold voltage/mobility information of a driving transistor DT or degradation information of the organic light emitting diode OLED is obtained by sensing current flowing through the driving transistor DT or current flowing through the organic light emitting diode OLED is referred to as a 'current sensing period T3'.

The display unit 150 includes pixels 160 respectively disposed at crossing portions of the data lines D1 to Dm, the scan lines S1 to Sn, and the sensing control lines CL11 to CL1n and CL21 to CL2n. Here, the data lines D1 to Dm are arranged in a vertical direction, and the scan lines S1 to Sn and the sensing control lines CL11 to CL1n and CL21 to CL2n are arranged in a horizontal direction.

Each pixel 160 is coupled to a corresponding data line among the data lines D1 to Dm, a corresponding scan line among the scan lines S1 to Sn, and corresponding sensing control lines among the sensing control lines CL11 to CL1n and CL21 to CL2n.

Hereinafter, aspects of embodiments of the present invention will be described by taking, as an example, a pixel 160 disposed on an m-th row and an n-th column. The pixel 160 includes a driving circuit 161, the organic light emitting diode OLED, and a light receiving circuit 163.

The driving circuit 161 supplies, to the organic light emitting diode OLED, driving current corresponding to a data signal supplied through a data line Dm during the scan period T1. The driving circuit 161 supplies, to a feedback line Fm, a first sensing current corresponding to the threshold voltage/mobility information of the driving transistor DT or the degradation information of the organic light emitting diode OLED.

The driving circuit 161 includes a scan transistor ST, the driving transistor DT, the capacitor Cst, and a first switching transistor ST1.

The scan transistor ST is coupled between the data line Dm and a gate electrode of the driving transistor DT. The scan transistor ST is turned on in response to a scan signal supplied through a scan line Sn. A first electrode of the scan transistor ST is coupled to the data line Dm, and a second electrode of the scan transistor ST is coupled to the gate electrode of the driving transistor DT and to one end of the capacitor Cst. A gate electrode of the scan transistor ST is coupled to the scan line Sn.

The 'first electrode' may refer to any one of a source electrode and a drain electrode, and the 'second electrode' may refer to the other one of the source and drain electrodes.

The scan signal is supplied during the scan period T1, and thus the scan transistor ST charges, in the capacitor Cst, a voltage corresponding to the data signal supplied through the data line Dm during the scan period T1.

The driving transistor DT controls the amplitude of driving current flowing from a first power source ELVDD to a second power source ELVSS via the organic light emitting diode OLED. The driving transistor DT allows driving current corresponding to the voltage charged in the capacitor Cst to flow. A first electrode of the driving transistor DT is coupled to the first power source ELVDD, and a second electrode of the driving transistor DT is coupled to an anode electrode of the organic light emitting diode OLED. The gate electrode of the driving transistor DT is coupled to the second electrode of the scan transistor ST and to a first electrode of the capacitor Cst.

The capacitor Cst is coupled between the gate electrode of the driving transistor DT and the first power source ELVDD. For example, one end of the capacitor Cst is coupled to the second electrode of the scan transistor ST and to the gate electrode of the driving transistor DT, and the other end of the capacitor Cst is coupled to the first power source ELVDD and to the first electrode of the driving transistor DT.

The first switching transistor ST1 is coupled between the anode electrode of the organic light emitting diode OLED and the feedback line Fm. The first switching transistor ST1 is turned on in response to the first sensing control signal supplied through the first sensing control line CL1n. For example, a first electrode of the first switching transistor ST1 is coupled to the second electrode of the driving transistor DT and to the anode electrode of the organic light emitting diode OLED, and a second electrode of the first switching transistor ST1 is coupled to the feedback line Fm. A gate electrode of the first switching transistor ST is coupled to the first sensing control line CL1n.

The first sensing control signal is supplied during the current sensing period T3, and thus the first switching transistor ST1 forms a current path from the driving transistor DT or the organic light emitting diode OLED to the sensing unit 170. The sensing unit 170 senses the threshold voltage/mobility information of the driving transistor DT or the degradation information of the organic light emitting diode OLED, using (or utilizing) the first sensing current flowing through the current path.

The organic light emitting diode OLED is coupled between the driving circuit 161 and the second power source ELVSS. For example, the anode electrode of the organic light emitting diode OLED is coupled to the second electrode of the driving transistor DT, and a cathode electrode of the organic light emitting diode OLED is coupled to the second power source ELVSS. The organic light emitting diode OLED emits light with a luminance corresponding to (e.g., according to) the driving current supplied from the driving circuit 161.

The light receiving circuit 163 supplies, to the feedback line Fm, a second sensing current corresponding to the luminance of the organic light emitting diode OLED during the emission period T2. The light receiving circuit 163 includes a photo transistor PT and a second switching transistor ST2.

The photo transistor PT generates a second sensing current corresponding to the luminance of the organic light emitting diode OLED. The photo transistor PT includes a gate electrode configured to receive a first bias voltage Vbias1, a first electrode configured to receive a second bias voltage Vbias2, and a second electrode coupled to a first electrode of the second switching transistor ST2. When light or leakage current from the organic light emitting diode OLED is applied to a base region of the photo transistor PT, the photo transistor PT generates a second sensing current corresponding to the light or the leakage current through a second electrode, e.g., a drain electrode thereof.

The second switching transistor ST2 is coupled between the photo transistor PT and the feedback line Fm. The second switching transistor ST2 is turned on in response to the second sensing control signal supplied through the second sensing control line CL2n. A first electrode of the second switching transistor ST2 is coupled to the second electrode of the photo transistor PT, and a second electrode of the second switching transistor ST2 is coupled to the feedback line Fm. A gate electrode of the second switching transistor ST2 is coupled to the second sensing control line CL2n.

The second sensing control signal is supplied during the emission period T2, and thus the second switching transistor ST2 supplies, to the feedback line Fm, the second sensing current generated by the photo transistor PT during the emission period T2.

The sensing unit 170 generates current information CI corresponding to first sensing currents and second sensing currents, supplied through feedback lines F1 to Fm. For convenience of illustration, only a portion of the sensing unit 170, for measuring the first and second sensing currents supplied through the feedback line Fm from the pixel 160, has been illustrated in FIG. 2.

The sensing unit 170 includes an amplifier AMP and a feedback capacitor Cf in order to measure the first and second sensing currents.

The amplifier AMP includes a first input terminal (e.g., a positive input terminal) coupled to the feedback line Fm, a second input terminal (e.g., a negative input terminal) configured to receive a reference voltage Vref, and an output terminal configured to output an output voltage Vout corresponding to the first or second sensing current.

One end of the feedback capacitor Cf is coupled to the first input terminal of the amplifier AMP, e.g., the feedback line Fm, and the other end of the feedback capacitor Cf is coupled to the output terminal of the amplifier AMP.

The dynamic ranges of the first and second sensing currents are generally different from each other. Therefore, the potential of the reference voltage Vref and the capacitance of the feedback capacitor Cf are changed according to the first and second sensing currents having different dynamic ranges from each other. For example, during the current sensing period T3, the potential of the reference voltage Vref may be V1, and the capacitance of the feedback capacitor Cf may be C1. On the other hand, during the emission period T2, the potential of the reference voltage Vref may be V2, and the capacitance of the feedback capacitor Cf may be C2. That is, the potential of the reference voltage Vref during the current sensing period T3 is different from that of the reference voltage Vref during the emission period T2, and the capacitance of the feedback capacitor Cf during the current sensing period T3 is different from that of the feedback capacitor Cf during the emission period T2.

The sensing unit 170 supplies, to the compensation unit 180, current information CI on the first sensing currents and second sensing currents, respectively supplied from the pixels 160.

The compensation unit 180 calculates compensation values with respect to the respective pixels 160 according to the current information CI supplied from the sensing unit 170. The compensation unit 180 performs a first compensation related to the relationship between the data signal and the driving current, based on first sensing current values, and performs a second compensation related to the relationship between the driving current and the luminance, based on second sensing current values. The compensation unit 180 generates the compensation data CD including the compensation values, and supplies the generated compensation data CD to the timing controller 110.

As such, the organic light emitting display 100 performs the first compensation based on the first sensing current values and the second compensation based on the second sensing current values, thereby effectively removing a difference between the pixels 160.

According to an embodiment, the organic light emitting display 100 may further include a voltage adjusting unit 190.

In an example embodiment, the voltage adjusting unit 190 adjusts a first bias voltage Vbias1 and a second bias voltage Vbias2 according to an accumulation use time of the photo transistor PT. The photo transistor PT is degraded in proportion to the accumulation use time. Thus, the voltage adjusting unit 190 counts an accumulation use time of the photo transistor PT, and adjusts the potential of the first bias voltage Vbias1 and the potential of the second bias voltage Vbias2 according to the counted accumulation use time.

The accumulation use time of the photo transistor PT and the accumulation emission time of the organic light emitting diode OLED are substantially similar to each other, and thus, in another embodiment, the voltage adjusting unit 190 can adjust the first bias voltage Vbias1 and the second bias voltage Vbias2, based on the accumulation emission time of the organic light emitting diode OLED rather than the accumulation use time of the photo transistor PT.

The voltage adjusting unit 190 includes a counter 191 and a bias voltage generating unit 193.

The counter 191 counts an accumulation emission time of the organic light emitting diode OLED or an accumulation use time of the photo transistor PT, and generates an accumulation data ADATA with respect to the counted accumulation emission or use time. The counter 191 supplies the generated accumulation data ADATA to the bias voltage generating unit 193.

The bias voltage generating unit 193 adjusts the potential of the first bias voltage Vbias1 and the potential of the second bias voltage Vbias2, based on the accumulation data ADATA. Specifically, the bias voltage generating unit 193 reads, from a look-up table, potentials of the first and second bias voltages Vbias1 and Vbias2 corresponding to the accumulation emission time of the organic light emitting diode OLED or accumulation use time of the photo transistor PT, included in the accumulation data ADATA. The bias voltage generating unit 193 generates the first and second bias voltages Vbias1 and Vbias2 according to the potentials of the first and second bias voltages Vbias1 and Vbias2 read from the look-up table, and supplies the generated first and second bias voltages Vbias1 and Vbias2 to each pixel 160.

As such, the voltage adjusting unit 190 adjusts the first bias voltage Vbias1 and the second bias voltage Vbias2 according to the accumulation use time of the photo transistor PT or the accumulation emission time of the organic light emitting diode OLED, so that the sensing unit 170 can measure luminance of each pixel 160 more effectively.

Figure 5:
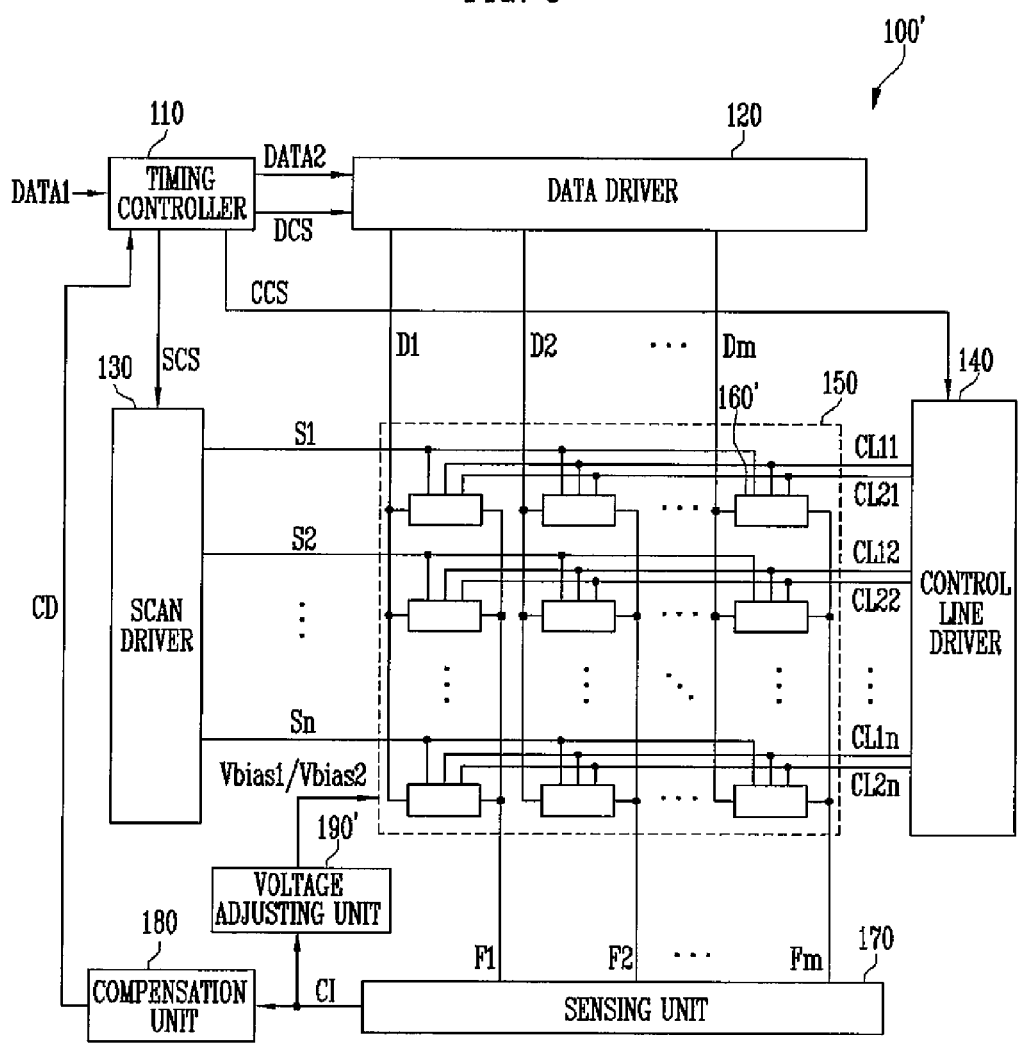
FIG. 5 is a block diagram illustrating an organic light emitting display according to another embodiment of the present invention.
Figure 6:
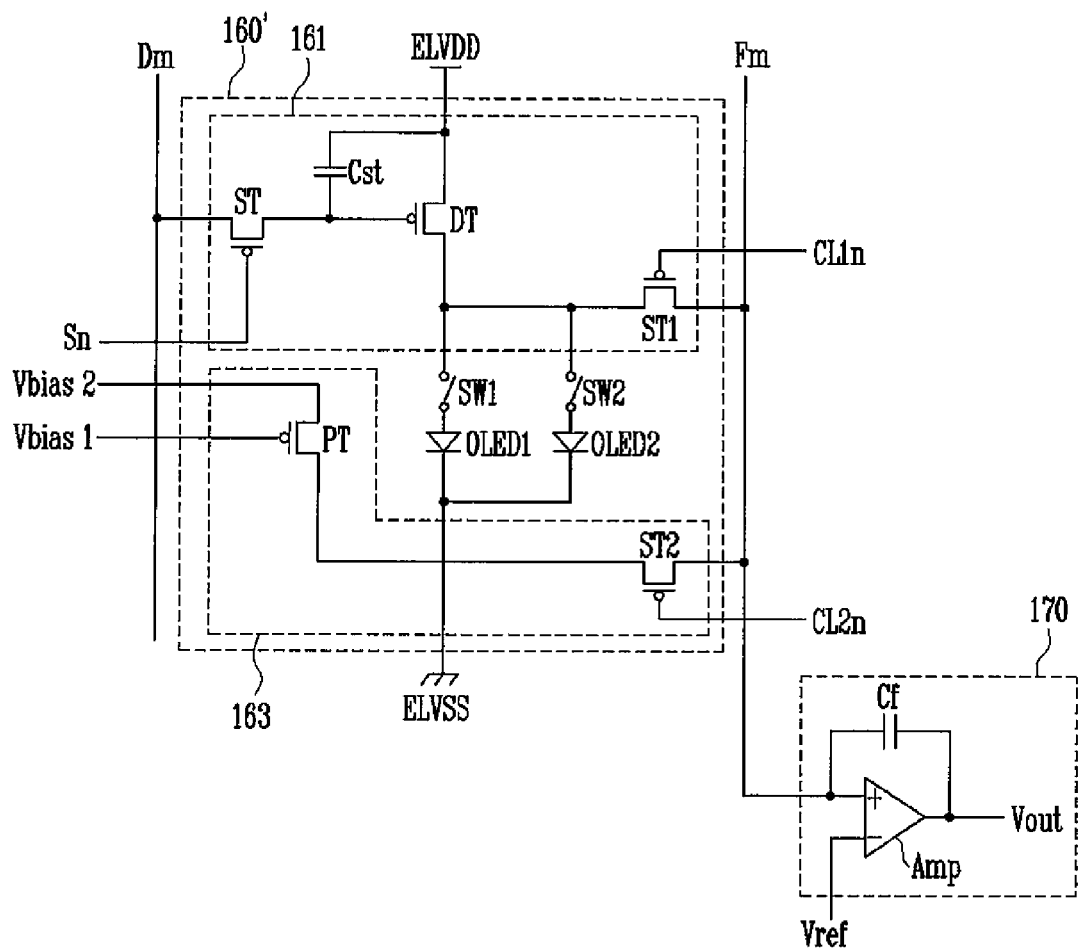
FIG. 6 is a circuit diagram illustrating a pixel and a sensing unit, shown in FIG. 5.

FIG. 5 is a block diagram illustrating an organic light emitting display according to another embodiment of the present invention. FIG. 6 is a circuit diagram illustrating a pixel and a sensing unit, shown in FIG. 5. FIG. 7 is a waveform diagram illustrating control signals supplied to the pixel and the sensing unit, shown in FIG. 5.

The organic light emitting display 100' shown in FIG. 5 and the pixel 160' shown in FIG. 6 are substantially similar to the organic light emitting display 100 shown in FIG. 1 and the pixel 160 shown in FIG. 2, except the operation of a voltage adjusting unit 190', and therefore, detailed description thereof may have been omitted.

Referring to FIGS. 5 to 7, the voltage adjusting unit 190' adjusts the first bias voltage Vbias1 and the second bias voltage Vbias2 according to the current information CI supplied from the sensing unit 170. The pixel 160' includes a first organic light emitting diode OLED1, e.g., a main organic light emitting diode, and a second organic light emitting diode OLED2, e.g., a reference organic light emitting diode.

The first organic light emitting diode OLED1 is coupled to the driving circuit 161 through a first switch SW1, and the second organic light emitting diode OLED2 is coupled to the driving circuit 161 through a second switch SW2. Here, the first organic light emitting diode OLED1 is used (or utilized) as a main element, and the second organic light emitting diode OLED2 is used (or utilized) as a reference element. For example, the first organic light emitting diode OLED1 performs a function of emitting light with a luminance corresponding to the driving current supplied from the driving circuit 161. On the other hand, the second organic light emitting diode OLED2 acts as the reference element for measuring degradation of the photo transistor PT.

The first and second switches SW1 and SW2 are alternately turned on during the emission period T2. Here, the turn-on period Tb of the second switch SW2 is minimally set in order to prevent or reduce the degradation of the second organic light emitting diode OLED2. That is, the turn-on period Ta of the first switch SW1 is longer than the turn-on period Tb of the second switch SW2.

The voltage adjusting unit 190' adjusts the first bias voltage Vbias1 and the second bias voltage Vbias2 according to a second sensing current measured during the turn-on period Tb of the second switch SW2. That is, the voltage adjusting unit 190' estimates a degradation degree of the photo transistor PT according to a second sensing current corresponding to the luminance of the second organic light emitting diode OLED2, assuming that the second organic light emitting diode OLED 2 is not degraded. The voltage adjusting unit 190' adjusts the first bias voltage Vbias1 and the second bias voltage Vbias2 according to the estimated degradation degree of the photo transistor PT. Accordingly, the photo transistor PT can generate the second sensing current more effectively.

By way of summation and review, in an organic light emitting display, a difference in luminance between pixels may occur due to a difference between the pixels, e.g., a difference in threshold voltage/mobility between driving transistors, a difference in degradation between organic light emitting diodes, or the like. Due to the difference in luminance between the pixels, a luminance spot may occur in the organic light emitting display, and the image quality of the organic light emitting display may be deteriorated.

In the pixel and the organic light emitting display including the same according to embodiments of the present invention, it may be possible to remove or reduce a luminance spot by removing or reducing a difference between the pixels Example embodiments have been disclosed herein, and although specific terms are employed, they are used and are to be interpreted in a generic and descriptive sense only and not for purposes of limitation. In some instances, as would be apparent to one of ordinary skill in the art at the time of the invention, features, characteristics, and/or elements described in connection with a particular embodiment may be used singly or in combination with features, characteristics, and/or elements described in connection with other embodiments, unless otherwise specifically indicated. Accordingly, it will be understood by those of ordinary skill in the art that various changes in form and detail may be made without departing from the spirit and scope of the present invention as set forth in the following claims, and their equivalents.

What is claimed is:

1. A pixel comprising:
an organic light emitting diode;
a driving circuit configured to supply a driving current corresponding to a data signal supplied through a data line during a scan period to the organic light emitting diode during an emission period, and to supply a first sensing current corresponding to threshold voltage/mobility information of a driving transistor or degradation information of the organic light emitting diode to a feedback line during a current sensing period; and
a light receiving circuit configured to supply a second sensing current corresponding to luminance of the organic light emitting diode to the feedback line during the emission period,
wherein the light receiving circuit is configured to receive a first bias voltage and a second bias voltage, and each of the first and second bias voltages is adjusted according to an accumulation emission time of the organic light emitting diode.

2. The pixel of claim 1, wherein the driving circuit comprises:
a scan transistor configured to turn on in response to a scan signal to charge a capacitor with a voltage corresponding to a data signal supplied through the data line;
a driving transistor configured to adjust an amplitude of the driving current supplied from a first power source to a second power source via the organic light emitting diode; and
a first switching transistor coupled between an anode of the organic light emitting diode and the feedback line, the first switching transistor being configured to turn on in response to a first sensing control signal.

3. The pixel of claim 2, wherein the light receiving circuit comprises:
a photo transistor configured to generate the second sensing current corresponding to the luminance of the organic light emitting diode; and
a second switching transistor coupled between the photo transistor and the feedback line, the second switching transistor being configured to turn on in response to a second sensing control signal.

4. The pixel of claim 3, wherein the scan signal is supplied during the scan period, the first sensing control signal is supplied during the current sensing period, and the second sensing control signal is supplied during the emission period.

5. The pixel of claim 3, wherein the photo transistor comprises:
a gate electrode configured to receive the first bias voltage;
a source electrode configured to receive the second bias voltage; and
a drain electrode coupled to the second switching transistor.

6. The pixel of claim 1, wherein the light receiving circuit comprises a photo transistor configured to generate the second sensing current corresponding to the luminance of the organic light emitting diode, the photo transistor comprising:
a gate electrode configured to receive the first bias voltage; and
a source electrode configured to receive the second bias voltage.

7. An organic light emitting display, comprising:
a display unit comprising pixels respectively at crossing portions of data lines, scan lines, and feedback lines;

a data driver configured to supply data signals to the data lines;

a scan driver configured to sequentially supply scan signals to the scan lines during a scan period;

a sensing unit configured to generate current information corresponding to a first sensing current supplied during a current sensing period through a corresponding feedback line among the feedback lines from each one of the pixels and a second sensing current supplied during an emission period through the corresponding feedback line from the each one of the pixels; and a compensation unit configured to generate a compensation data comprising compensation values with respect to respective ones of each of the pixels, based on the current information, wherein the each one of the pixels comprises an organic light emitting diode and a light receiving circuit configured to supply the second sensing current corresponding to luminance of the organic light emitting diode to the corresponding feedback line during the emission period, and wherein the light receiving circuit is configured to receive a first bias voltage and a second bias voltage, and each of the first and second bias voltages is adjusted according to an accumulation emission time of the organic light emitting diode.

8. The organic light emitting display of claim 7, wherein the each one of the pixels further comprises:

a driving circuit configured to supply a driving current corresponding to a data signal supplied through a corresponding data line among the data lines during the scan period to the organic light emitting diode during the emission period, and to supply the first sensing current corresponding to threshold voltage/mobility information of a driving transistor or degradation information of the organic light emitting diode to the corresponding feedback line during the current sensing period.

9. The organic light emitting display of claim 8, wherein the driving circuit comprises:

a scan transistor configured to turn on in response to the scan signal to charge a capacitor with a voltage corresponding to the data signal supplied through the corresponding data line;

a driving transistor configured to adjust an amplitude of the driving current supplied from a first power source to a second power source via the organic light emitting diode; and a first switching transistor coupled between an anode of the organic light emitting diode and the corresponding feedback line, the first switching transistor being configured to turn on in response to a first sensing control signal.

10. The organic light emitting display of claim 9, wherein the light receiving circuit comprises:

a photo transistor configured to generate the second sensing current corresponding to the luminance of the organic light emitting diode; and a second switching transistor coupled between the photo transistor and the corresponding feedback line, the second switching transistor being configured to turn on in response to a second sensing control signal.

11. The organic light emitting display of claim 10, further comprising a control line driver configured to supply the first sensing control signal during the current sensing period, and to supply the second sensing control signal during the emission period.

12. The organic light emitting display of claim 10, wherein the photo transistor comprises:

a gate electrode configured to receive the first bias voltage;

a source electrode configured to receive the second bias voltage; and a drain electrode coupled to the second switching transistor.

13. The organic light emitting display of claim 12, further comprising a voltage adjusting unit configured to adjust the first bias voltage and the second bias voltage.

14. The organic light emitting display of claim 7, further comprising a timing controller configured to convert a first image data supplied from an outside thereof into a second image data based on the compensation data, and to supply the second image data to the data driver.

15. An organic light emitting display, comprising:

a display unit comprising pixels respectively at crossing portions of data lines, scan lines, and feedback lines;

a data driver configured to supply data signals to the data lines;

a scan driver configured to sequentially supply scan signals to the scan lines during a scan period;

a sensing unit configured to generate current information corresponding to a first sensing current supplied during a current sensing period through a corresponding feedback line among the feedback lines from each one of the pixels and a second sensing current supplied during an emission period through the corresponding feedback line from the each one of the pixels; and a compensation unit configured to generate a compensation data comprising compensation values with respect to respective ones of each of the pixels, based on the current information, wherein the each one of the pixels comprises an organic light emitting diode, a reference organic light emitting diode coupled in parallel to the organic light emitting diode, and a light receiving circuit configured to supply the second sensing current corresponding to luminance of the organic light emitting diode to the corresponding feedback line during the emission period, wherein the reference organic light emitting diode configured to be alternately turned on with the organic light emitting diode during the emission period, and wherein the light receiving circuit is configured to receive a first bias voltage and a second bias voltage, and each of the first and second bias voltages is adjusted based on the second sensing current supplied during a period in which the reference organic light emitting diode emits light.

16. The organic light emitting display of claim 15, further comprising a voltage adjusting unit configured to adjust the first bias voltage and the second bias voltage.

17. The organic light emitting display of claim 15, wherein a turn-on period of the organic light emitting diode is longer than that of the reference organic light emitting diode.

* * * * *